United States Patent
Zheng

(10) Patent No.: US 10,223,993 B2
(45) Date of Patent: Mar. 5, 2019

(54) SHIFT REGISTER AND DRIVING METHOD THEREOF, GATE DRIVING CIRCUIT AND DISPLAY APPARATUS

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,543

(22) PCT Filed: Jun. 29, 2017

(86) PCT No.: PCT/CN2017/090775
§ 371 (c)(1),
(2) Date: Dec. 14, 2017

(87) PCT Pub. No.: WO2018/040711
PCT Pub. Date: Mar. 8, 2018

(65) Prior Publication Data
US 2018/0357974 A1 Dec. 13, 2018

(30) Foreign Application Priority Data
Aug. 29, 2016 (CN) .......................... 2016 1 0754883

(51) Int. Cl.
*G09G 3/36* (2006.01)
*G11C 19/28* (2006.01)
(52) U.S. Cl.
CPC .......... *G09G 3/3677* (2013.01); *G11C 19/28* (2013.01); *G09G 2310/0286* (2013.01); *G09G 2310/06* (2013.01)
(58) Field of Classification Search
CPC ......... G09G 3/3677; G09G 2310/0286; G09G 2310/06; G11C 19/28
See application file for complete search history.

(56) References Cited

U.S. PATENT DOCUMENTS

2007/0274433 A1   11/2007   Tobita et al.
2008/0278214 A1   11/2008   Yoon et al.
(Continued)

FOREIGN PATENT DOCUMENTS

CN   103077689 A   5/2013
CN   103198781 A   7/2013
(Continued)

OTHER PUBLICATIONS

Search Report and Written Opinion dated Sep. 28, 2017 from State Intellectual Property Office of the P.R. China.
Chinese Office Action dated Apr. 24, 2017.

*Primary Examiner* — Mark Edwards
(74) *Attorney, Agent, or Firm* — Dilworth & Barrese, LLP.; Michael J. Musella, Esq.

(57) ABSTRACT

A shift register includes: an input unit, configured to provide an input signal to a first node; a pull-up unit, configured to provide a voltage of a first supply voltage terminal to an output terminal; a pull-up control unit, configured to provide the voltage of the first supply voltage terminal or a voltage of a second supply voltage terminal to a second node; a pull-down unit, configured to provide a third clock signal from a third clock signal terminal to the output terminal; a pull-down control unit, configured to provide the voltage of the first supply voltage terminal to the first node; a first noise reduction unit, configured to reduce electrical leakage of the input unit to the first node; and a second noise reduction unit, configured to reduce electrical leakage of the pull-down control unit to the first node.

14 Claims, 4 Drawing Sheets

(56) References Cited

U.S. PATENT DOCUMENTS

2016/0218707 A1* 7/2016 Park .................. G09G 3/3677
2016/0253975 A1* 9/2016 Yang .................. G11C 19/28
                                                                345/58

FOREIGN PATENT DOCUMENTS

| CN | 103426414 A | 12/2013 |
| CN | 103714789 A | 4/2014 |
| CN | 104715710 A | 6/2015 |
| CN | 104835476 A | 8/2015 |
| CN | 105118417 A | 12/2015 |
| CN | 105679229 A | 6/2016 |
| CN | 106297697 A | 1/2017 |

* cited by examiner

---- known shift register
—— shift register in present disclosure

SHIFT REGISTER AND DRIVING METHOD THEREOF, GATE DRIVING CIRCUIT AND DISPLAY APPARATUS

The present application claims the priority of Chinese patent application No. 201610754883.4 filed on Aug. 29, 2016, and the entire content disclosed by the Chinese patent application is incorporated herein by reference as part of the present application.

TECHNICAL FIELD

The present disclosure relates to a shift register and a driving method thereof, a gate driving circuit and a display apparatus including the shift register.

BACKGROUND

Thin film transistor-liquid crystal displays (TFT-LCDs) are widely used in various fields of production and living and use an M*N pixel matrix to display by progressive scanning. During the process of displaying, the TFT-LCD drives each pixel in the display panel to display by driving circuits. The driving circuits of a TFT-LCD mainly include a gate driving circuit and a data driving circuit. The data driving circuit is used to sequentially latch the input data in accordance with the timing of a clock signal, convert the latched data into analog signals, and input the analog signals to the data lines of the display panel. The gate driving circuit is typically implemented with shift registers, and the shift registers convert a clock signal into on/off voltages and output them to the gate lines of the display panel respectively. Each of the gate lines of the display panel is typically coupled with one shift register (i.e., the shift register in one stage). Pixels in the display panel are progressively scanned by the shift registers which output turn-on voltages in turn.

In the field of display, in order to continuously improve display effect and user experience, the displays having high definition and high number of pixels (Pixels Per Inch, PPI for short) have become a hot research topic. However, as the number of pixels increases, the number of pixels driven by a gate line in each row also increases and the load on the shift register increases. Therefore, it is necessary to improve the driving ability of the shift register.

SUMMARY

At least one embodiment of the present disclosure provides a shift register and a driving method thereof, which can reduce the noise at the output terminal of the shift register and improve the driving ability of the shift register.

An aspect of the present disclosure provides a shift register, comprising: an input unit, a first terminal of the input unit being connected with an input terminal of the shift register to receive an input signal from the input terminal, a second terminal of the input unit being connected with a first clock signal terminal, and a third terminal of the input unit being connected with a first node, and the input unit being configured to provide the input signal to the first node under control of a first clock signal from the first clock signal terminal; a pull-up unit, a first terminal of the pull-up unit being connected with a first supply voltage terminal, a second terminal of the pull-up unit being connected with a second node, and a third terminal of the pull-up unit being connected with an output terminal of the shift register, and the pull-up unit being configured to provide a voltage of the first supply voltage terminal to the output terminal under control of a voltage of the second node; a pull-up control unit, a first terminal of the pull-up control unit being connected with a second clock signal terminal, a second terminal of the pull-up control unit being connected with the first supply voltage terminal, a third terminal of the pull-up control unit being connected with the second node, a fourth terminal of the pull-up control unit being connected with the input terminal, and a fifth terminal of the pull-up control unit being connected with a second supply voltage terminal, and the pull-up control unit being configured to provide the voltage of the first supply voltage terminal to the second node under control of the input signal or to provide a voltage of the second supply voltage terminal to the second node under control of a second clock signal from the second clock signal terminal; a pull-down unit, a first terminal of the pull-down unit being connected with the first node, a second terminal of the pull-down unit being connected with a third clock signal terminal, and a third terminal of the pull-down unit being connected with the output terminal, and the pull-down unit being configured to provide a third clock signal from the third clock signal terminal to the output terminal under control of a voltage of the first node; a pull-down control unit, a first terminal of the pull-down control unit being connected with the first supply voltage terminal, a second terminal of the pull-down control unit being connected with the first node, and a third terminal of the pull-down control unit being connected with the second node, and the pull-down control unit being configured to provide the voltage of the first supply voltage terminal to the first node under control of a voltage of the second node; a first noise reduction unit, a first terminal of the first noise reduction unit being connected with the third clock signal terminal, a second terminal of the first noise reduction unit being connected with the output terminal, and a third terminal of the first noise reduction unit being connected with the third node, and the first noise reduction unit being configured to reduce electrical leakage of the input unit to the first node by adjusting a voltage of the third node; and a second noise reduction unit, a first terminal of the second noise reduction unit being connected with a fourth node, a second terminal of the second noise reduction unit being connected with the first node, and a third terminal of the second noise reduction unit being connected with the second supply voltage terminal, and the second noise reduction unit being configured to reduce electrical leakage of the pull-down control unit to the first node by adjusting a voltage of the fourth node; wherein the third node is a connection node between the first noise reduction unit and the input unit, and the fourth node is a connection node between the second noise reduction unit and the pull-down control unit.

For example, the input unit comprises: a first transistor, with a gate electrode of the first transistor being connected with the first clock signal terminal, a first electrode of the first transistor being connected with the input terminal and a second electrode of the first transistor being connected with the third node; and a second transistor, with a gate electrode of the second transistor being connected with the first clock signal terminal, a first electrode of the second transistor being connected with the third node and a second electrode of the second transistor being connected with the first node.

For example, the pull-up unit comprises: a third transistor, with a gate electrode of the third transistor being connected with the second node, a first electrode of the third transistor being connected with the first supply voltage terminal and a second electrode of the third transistor being connected with the output terminal; and a first capacitor, with a first end of the first capacitor being connected with the second node and a second end of the first capacitor being connected with the first supply voltage terminal.

For example, the pull-up control unit comprises: a fourth transistor, with a gate electrode of the fourth transistor being connected with the input terminal, a first electrode of the fourth transistor being connected with the first supply voltage terminal and a second electrode of the fourth transistor being connected with the second node; and a fifth transistor, with a gate electrode of the fifth transistor being connected with the second clock signal terminal, a first electrode of the fifth transistor being connected with the second node and a second electrode of the fifth transistor being connected with the second supply voltage terminal.

For example, the pull-down unit comprises: a sixth transistor, with a gate electrode of the sixth transistor being connected with the first node, a first electrode of the sixth transistor being connected with the output terminal and a second electrode of the sixth transistor being connected with the third clock signal terminal; and a second capacitor, with a first end of the second capacitor being connected with the first node and a second end of the second capacitor being connected with the output terminal.

For example, the pull-down control unit comprises: a seventh transistor, with a gate electrode of the seventh transistor being connected with the second node, a first electrode of the seventh transistor being connected with the first supply voltage terminal and a second electrode of the seventh transistor being connected with the fourth node; and an eighth transistor, with a gate electrode of the eighth transistor being connected with the second node, a first electrode of the eighth transistor being connected with the fourth node and a second electrode of the eighth transistor being connected with the first node.

For example, the first noise reduction unit comprises: a ninth transistor, with a gate electrode of the ninth transistor being connected with the output terminal, a first electrode of the ninth transistor being connected with the third clock signal terminal and a second electrode of the ninth transistor being connected with the third node.

For example, the second noise reduction unit comprises: a tenth transistor, with a gate electrode of the tenth transistor being connected with the first node, a first electrode of the tenth transistor being connected with the fourth node and a second electrode of the tenth transistor being connected with the second supply voltage terminal.

For example, the above-described transistors are all p-type transistors.

For example, the duty cycles of the first, second and third clock signal from the above-described first, second and third clock signal terminal are 33%.

For example, the first supply voltage terminal is a high supply voltage terminal while the second supply voltage terminal is a low supply voltage terminal.

Another aspect of the present disclosure provides a driving method applicable to a shift register comprising an input unit, a pull-up unit, a pull-up control unit, a pull-down unit, a pull-down control unit, a first noise reduction unit and a second noise reduction unit, the driving method comprises: providing an input signal to a first node by the input unit; providing a voltage of a first supply voltage terminal to an output terminal of the shift register by the pull-up unit; providing the voltage of the first supply voltage terminal or a voltage of a second supply voltage terminal to a second node by the pull-up control unit; providing a third clock signal from a third clock signal terminal to the output terminal by the pull-down unit; providing the voltage of the first supply voltage terminal to the first node by the pull-down control unit; reducing electrical leakage of the input unit to the first node by adjusting a voltage of a third node by the first noise reduction unit; and reducing electrical leakage of the pull-down control unit to the first node by adjusting a voltage of a fourth node by the second noise reduction unit;

wherein the first node is a connection node among the input unit, the pull-down unit, the pull-down control unit and the second noise reduction unit, the second node is a connection node among the pull-up unit, the pull-up control unit, and the pull-down control unit, the third node is a connection node between the first noise reduction unit and the input unit, and fourth node is a connection node between the second noise reduction unit and the pull-down control unit.

For example, the first supply voltage terminal is a high supply voltage terminal while the second supply voltage terminal is a low supply voltage terminal.

For example, a duty cycle of the third clock signal from the above-described third clock signal terminal is 33%.

Still another aspect of the disclosure provides a gate driving circuit, which comprises the above-described shift register.

Further still another aspect of the disclosure provides a display apparatus, which comprises the above-described gate driving circuit.

According to embodiments of the present disclosure, in a shift register and a driving method thereof, a gate driving circuit and a display apparatus including the shift register, a corresponding level is connected to the connection point of the series-connection transistors to reduce the leakage current at the output phase of the gate level of the driving transistor by adopting a series-connection transistor structure and a timing control, thereby reducing the noise at the output terminal of the shift register and improving the driving ability of the shift register.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The transistors used in all the embodiments of the present disclosure can be thin film transistors or field effect transistors, or other devices with the same characteristics. In the present embodiment, the drain electrode and source electrode of each transistor can be interchanged. Therefore, the drain electrode and the source electrode of each transistor in the embodiments of the present disclosure are no difference in practice. Here, just to distinguish between the two electrodes of a transistor other than its gate electrode, one of them is referred to as a drain electrode while the other is referred to as a source electrode.

The present disclosure provides a shift register, which can reduce the noise at the output terminal of the shift register and improve the driving ability of the shift register.

Figure 1:
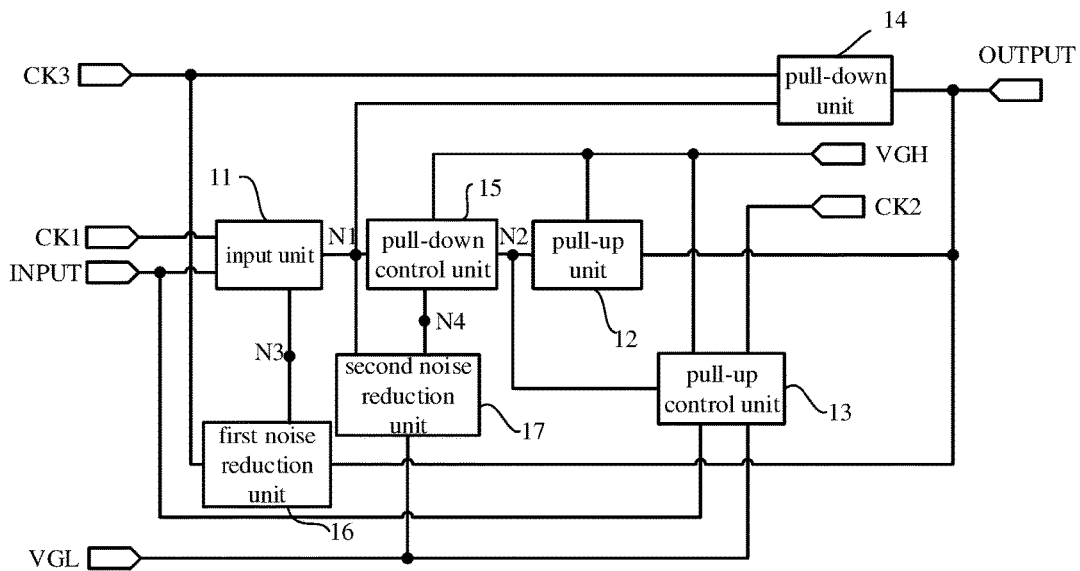
FIG. 1 shows a block diagram of a shift register according to an embodiment of the present disclosure.

FIG. 1 shows a block diagram of a shift register according to an embodiment of the present disclosure. As illustrated in FIG. 1, in an embodiment, the shift register includes an input unit 11, a pull-up unit 12, a pull-up control unit 13, a pull-down unit 14, a pull-down control unit 15, a first noise reduction unit 16, and a second noise reduction unit 17.

A first terminal of the input unit 11 is connected with an input terminal INPUT of the shift register to receive an input signal from the input terminal INPUT, a second terminal of the input unit 11 is connected with a first clock signal terminal CK1, and a third terminal of the input unit 11 is connected with a first node N1. The input unit 11 is configured to provide the input signal to the first node N1 under control of a first clock signal from the first clock signal terminal CK1.

A first terminal of the pull-up unit 12 is connected with a first supply voltage terminal VGH, a second terminal of the pull-up unit 12 is connected with a second node N2, and a third terminal of the pull-up unit 12 is connected with an output terminal OUTPUT of the shift register. The pull-up unit 12 is configured to provide a voltage of the first supply voltage terminal VGH to the output terminal OUTPUT under control of a voltage of the second node N2.

A first terminal of the pull-up control unit 13 is connected with a second clock signal terminal CK2, a second terminal of the pull-up control unit 13 is connected with the first supply voltage terminal VGH, a third terminal of the pull-up control unit 13 is connected with the second node N2, a fourth terminal of the pull-up control unit 13 is connected with the input terminal INPUT, and a fifth terminal of the pull-up control unit 13 is connected with a second supply voltage terminal VGL. The pull-up control unit 13 is configured to provide the voltage of the first supply voltage terminal VGH to the second node N2 under control of the input signal, or to provide a voltage of the second supply voltage terminal VGL to the second node N2 under control of a second clock signal from the second clock signal terminal CK2.

A first terminal of the pull-down unit 14 is connected with the first node N1, a second terminal of the pull-down unit 14 is connected with a third clock signal terminal CK3, and a third terminal of the pull-down unit 14 is connected with the output terminal OUTPUT. The pull-down unit 14 is configured to provide a third clock signal from the third clock signal terminal CK3 to the output terminal OUTPUT under control of a voltage of the first node N1.

A first terminal of the pull-down control unit 15 is connected with the first supply voltage terminal VGH, a second terminal of the pull-down control unit 15 is connected with the first node N1, and a third terminal of the pull-down control unit 15 is connected with the second node N2. The pull-down control unit 15 is configured to provide the voltage of the first supply voltage terminal VGH to the first node N1 under control of a voltage of the second node N2.

A first terminal of the first noise reduction unit 16 is connected with the third clock signal terminal CK3, a second terminal of the first noise reduction unit 16 is connected with the output terminal OUTPUT, and a third terminal of the first noise reduction unit 16 is connected with the third node N3. The first noise reduction unit 16 is configured to reduce the electrical leakage of the input unit 11 to the first node N1 by adjusting a voltage of the third node N3.

A first terminal of the second noise reduction unit 17 is connected with a fourth node N4, a second terminal of the second noise reduction unit 17 is connected with the first node N1, and a third terminal of the second noise reduction unit 17 is connected with the second supply voltage terminal VGL. The second noise reduction unit 17 is configured to reduce the electrical leakage of the pull-down control unit 15 to the first node N1 by adjusting a voltage of the fourth node N4.

The third node N3 is a connection node between the first noise reduction unit 16 and the input unit 11, and the fourth node N4 is a connection node between the second noise reduction unit 17 and the pull-down control unit 15.

The first noise reduction unit 16 and the second noise reduction unit 17 maintain the level of the first node N1 by reducing the electrical leakage of the input unit 11 and the pull-down control unit 15 to the first node N1, so as to reduce the noise at the output terminal of the shift register.

The duty cycles of the first, second and third clock signal from the above-described first, second and third clock signal terminal are 33%.

The first supply voltage terminal VGH is a high supply voltage terminal while the second supply voltage terminal VGL is a low supply voltage terminal.

Figure 2:
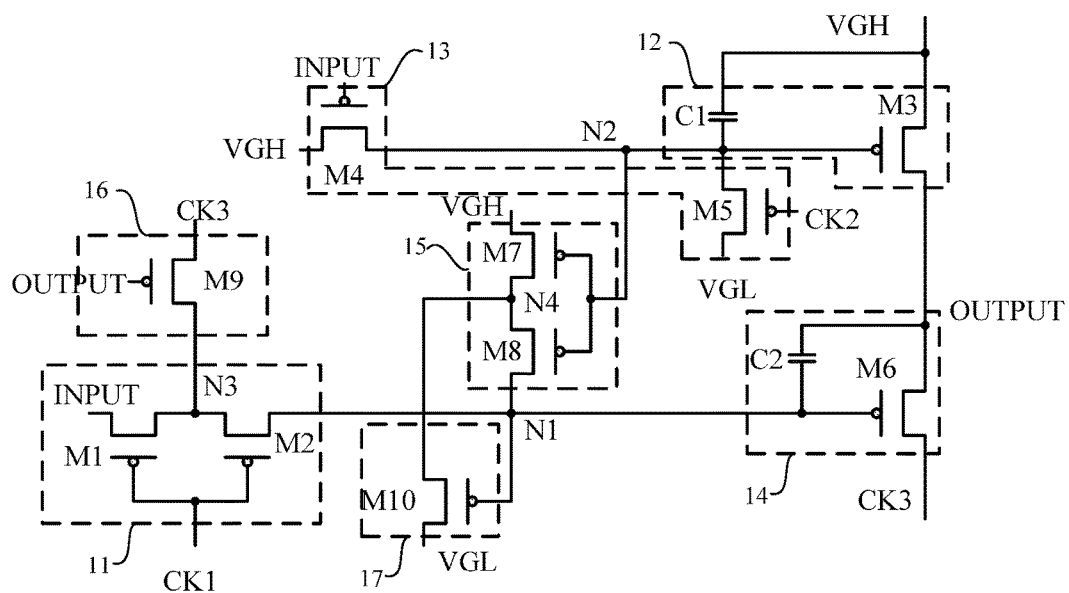
FIG. 2 shows an exemplary circuit structural diagram of a shift register according to an embodiment of the present disclosure.

FIG. 2 shows an exemplary circuit structural diagram of a shift register according to an embodiment of the present disclosure. Hereinafter, description is given with respect to a case where the transistors in FIG. 2 are all p-type transistors which are respectively turned on when low levels are inputted to their gate electrodes respectively.

As illustrated in FIG. 2, in an embodiment, for example, the input unit 11 includes a first transistor M1 and a second transistor M2. A gate electrode of the first transistor M1 is connected with the first clock signal terminal CK1, a first electrode of the first transistor M1 is connected with the input terminal INPUT, and a second electrode of the first transistor M1 is connected with the third node N3. A gate electrode of the second transistor M2 is connected with the first clock signal terminal CK1, a first electrode of the second transistor M2 is connected with the third node N3 and a second electrode of the second transistor M2 is connected with the first node N1. When the first clock signal from the first clock signal terminal CK1 is at a low level, the first transistor M1 and the second transistor M2 are both turned on, and the input signal from the input terminal INPUT is transmitted to the first node N1.

In an embodiment, for example, the pull-up unit 12 includes a third transistor M3 and a first capacitor C1. A gate electrode of the third transistor M3 is connected with the second node N2, a first electrode of the third transistor M3 is connected with the first supply voltage terminal VGH and a second electrode of the third transistor M3 is connected with the output terminal OUTPUT. A first end of the first capacitor C1 is connected with the second node N2 and a second end of the first capacitor C1 is connected with the first supply voltage terminal VGH. When the voltage of the second node N2 is at a low level, the third transistor M3 is turned on, and the voltage of the first supply voltage terminal VGH is provided to the output terminal OUTPUT.

In an embodiment, for example, the pull-up control unit 13 includes a fourth transistor M4 and a fifth transistor M5. A gate electrode of the fourth transistor M4 is connected with the input terminal INPUT, a first electrode of the fourth transistor M4 is connected with the first supply voltage terminal VGH and a second electrode of the fourth transistor M4 is connected with the second node N2. A gate electrode of the fifth transistor M5 is connected with the second clock signal terminal CK2, a first electrode of the fifth transistor M5 is connected with the second node N2 and a second electrode of the fifth transistor M5 is connected with the second supply voltage terminal VGL. For example, when the second clock signal from the second clock signal terminal VGL is at a low level, the fifth transistor M5 is turned on, and the voltage of the second supply voltage terminal VGL is provided to the second node N2; when the input signal from the input terminal INPUT is at a low level, the fourth transistor M4 is turned on, and the voltage of the first supply voltage terminal VGH is provided to the second node N2.

In an embodiment, for example, the pull-down unit 14 includes a sixth transistor M6 and a second capacitor C2. A gate electrode of the sixth transistor M6 is connected with the first node N1, a first electrode of the sixth transistor M6 is connected with the output terminal OUTPUT and a second electrode of the sixth transistor M6 is connected with the third clock signal terminal CK3. A first end of the second capacitor C2 is connected with the first node N1 and a second end of the second capacitor C2 is connected with the output terminal OUTPUT. When the voltage of the first node N1 is at a low level, the sixth transistor M6 is turned on, and the third clock signal from the third clock signal terminal CK3 is provided to the output terminal OUTPUT.

In an embodiment, for example, the pull-down control unit 15 includes a seventh transistor M7 and a eighth transistor M8. A gate electrode of the seventh transistor M7 is connected with the second node N2, a first electrode of the seventh transistor M7 is connected with the first supply voltage terminal VGH and a second electrode of the seventh transistor M7 is connected with the fourth node N4. A gate electrode of the eighth transistor M8 is connected with the second node N2, a first electrode of the eighth transistor M8 is connected with the fourth node N4 and a second electrode of the eighth transistor M8 is connected with the first node N1. When the voltage of the second node N2 is at a low level, the seventh transistor M7 and the eighth transistor M8 are respectively turned on, and the voltage of the first supply voltage terminal VGH is provided to the first node N1.

In an embodiment, for example, the first noise reduction unit 16 includes a ninth transistor M9, with a gate electrode of the ninth transistor M9 is connected with the output terminal OUTPUT, a first electrode of the ninth transistor M9 is connected with the third clock signal terminal CK3 and a second electrode of the ninth transistor M9 is connected with the third node N3. When the output signal of the output terminal OUTPUT is at a low level and the third clock signal from the third clock signal terminal CK3 is at a low level, the ninth transistor M9 is turned on, so that the voltage of the third node N3 is pulled down to reduce the electrical leakage of the above-described second transistor M2 to the first node N1 and reduce the influence on the level of the first node N1, which reduces the influence on the level of a gate electrode of the driving transistor, that is, the sixth transistor M6, reducing noise at the output terminal of the shift register and improve the driving ability of the driving transistor.

In an embodiment, for example, the second noise reduction unit 17 includes a tenth transistor M10, with a gate electrode of the tenth transistor M10 is connected with the first node N1, a first electrode of the tenth transistor M10 is connected with the fourth node N4 and a second electrode of the tenth transistor M10 is connected with the second supply voltage terminal VGL. When the voltage of the first node N1 is at a low level, the tenth transistor M10 is turned on, so that the voltage of the fourth node N4 is pulled down to reduce electrical leakage of the above-described eighth transistor M8 to the first node N1 and reduce the influence on the level of the first node N1, so that the level of the first node N1 can be continuously maintained at a low level, which reduces the influence on the level of a gate electrode of the driving transistor, that is, the sixth transistor M6, reducing noise at the output terminal and improve the driving ability of the driving transistor.

It can be understood that the specific circuits structures of the input unit 11, the pull-up unit 12, the pull-up control unit 13, the pull-down unit 14, the pull-down control unit 15, the first noise reduction unit 16 and the second noise reduction unit 17 as illustrated in FIG. 2 are only exemplary. Any other appropriate circuit structure can be adopted for each unit as long as the respective functions can be implemented, which is not limited in the present disclosure.

Figure 3:
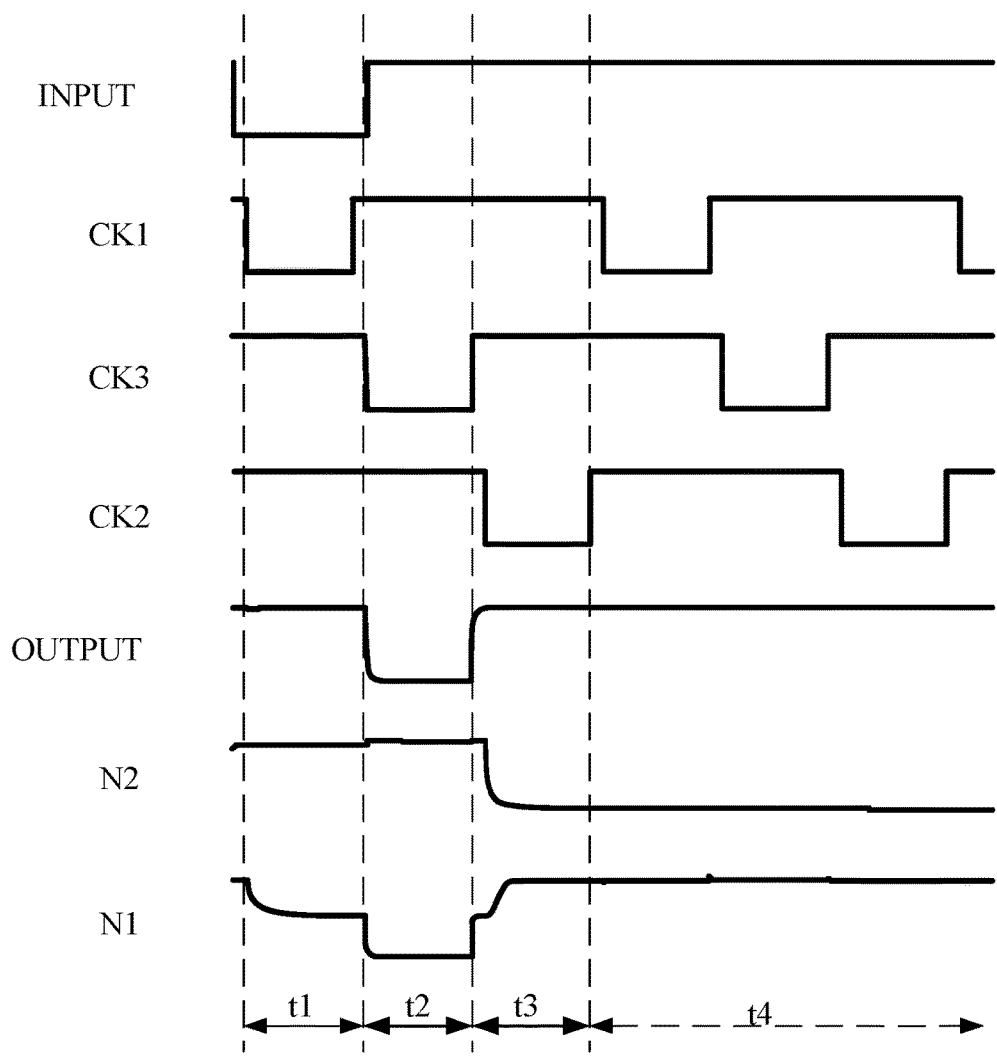
FIG. 3 shows a timing chart of respective signals when the shift register in FIG. 2 is scanned.

FIG. 3 shows a timing chart of respective signals when the shift register in FIG. 2 is scanning. In the following, the specific working process of the shift register according to an embodiment of the present disclosure during scanning will be described with reference to FIG. 2 and FIG. 3.

In the present embodiment, the first supply voltage terminal VGH is a high supply voltage terminal while the second supply voltage terminal VGL is a low supply voltage terminal.

During the first phase t1 (the input phase), the signal input from the input terminal INPUT and the first clock signal of the first clock signal terminal CK1 are at a low level VL (which also represents the level of the second supply voltage terminal VGL in the present embodiment), and the third clock signal of the third clock signal terminal CK3 is at a high level VH (which also represents the level of the first supply voltage terminal VGH in the present embodiment). The first transistor M1 and the second transistor M2 are turned on, and the low level signal of the input terminal INPUT is transmitted to the first node N1, and at this time, the first node N1 is at a low level. Because there is produced a threshold loss when the p-type transistor transmits a low level, the level of the first node N1 is VL+|vthp|, where vthp represents the threshold voltage of the transistor (in this embodiment, it is assumed that all the transistors have the same threshold voltage). Because the first node N1 is at a low level, the driving transistor, that is, the sixth transistor M6, is turned on. Because the third clock signal of the third clock signal terminal CK3 is at a high level VH, the output terminal OUTPUT outputs a high-level output signal. At the same time, because the signal input from the input terminal INPUT is at a low level, the fourth transistor M4 is turned on, the level of the second node N2 is pulled to a high level of the first supply voltage terminal VGH and the third transistor M3 is turned off.

During the second phase t2 (the pull-down phase), the signal input from the input terminal INPUT and the first clock signal of the first clock signal terminal CK1 are at a high level VH, and the third clock signal of the third clock signal terminal CK3 is at a low level VL. Because the sixth transistor M6 is turned on in the phase t1 and the third clock signal of the third clock signal terminal CK3 is at a low level, the output terminal OUTPUT outputs a low-level output signal. Because the first clock signal of the first clock signal terminal CK1 is at a high level, the first transistor M1 and the second transistor M2 are turned off. The level of the second node N2 is pulled to a high level in the phase t1, so the seventh transistor M7 and the eighth transistor M8 are turned off, and the gate electrode of the sixth transistor M6 is in a floating state. Because a capacitor has the function of keeping the voltage difference across both ends thereof constant, the voltage difference (VL+|Vthp|−VH) across the two ends of the second capacitor C2 remains constant. Therefore, the level of the first node N1 decreases as the level of the output terminal OUTPUT decreases, and finally stabilizes at 2VL+|Vthp|−VH. The sixth transistor M6 operates in a linear region, the third clock signal of the third clock signal terminal CK3 is transmitted to the output terminal OUTPUT without a threshold loss, and the level of the output signal from the output terminal OUTPUT is the level VL. In this process, the output signal at a low level from the output terminal OUTPUT turns on the ninth transistor M9, the level of the third node N3 is pulled down, the leakage current of the second transistor M2 is reduced, and the influence on the level of the first node N1 is reduced, that is, the influence on the level of a gate electrode of the driving transistor (that is the sixth transistor M6) is reduced, reducing the noise at the output terminal of the shift register. At the same time, the level of the first node N1 is at a low level, the tenth transistor M10 is turned on and the level of the fourth node N4 is pulled down, so as to reduce the leakage current of the eighth transistor M8 and reduce the influence on the level of the first node N1. So the level of the first node N1 can be continuously maintained at a low level, which reduces the influence on the level of a gate electrode of the driving transistor (that is the sixth transistor M6), reduces the noise at the output terminal and improves the driving ability of the driving transistor.

During the third phase t3 (the pull-up phase), this phase is divided into two sub-phases. In the first sub-phase, the third clock signal of the third clock signal terminal CK3 jumps to the high level VH, and the second capacitor C2 has a function of keeping the voltage difference across both ends constant. Therefore, the level of the first node N1 also jumps to VL+|Vthp|. The sixth transistor M6 is still in an on-state and pulls up the level of the output signal from the output terminal OUTPUT to the high level VH of the third clock signal from the third clock signal terminal CK3. In the second sub-phase, the second clock signal of the second clock signal terminal CK2 jumps to the low level, the fifth transistor M5 is turned on, the level of the second node N2 is pulled down, the third transistor M3 is turned on, and the level of the output signal from the output terminal OUTPUT remains at high level VH. At the same time, the seventh transistor M7 and the eighth transistor M8 are turned on, the level of the first node N1 is pulled to the high level VH, and the sixth transistor M6 is turned off.

During the fourth phase t4 (the maintaining phase), the second clock signal of the second clock signal terminal CK2 periodically jumps to a low level and the level of the second node N2 remains at a low level, so that the third transistor M3 remains to turn on and the level of the output signal from the output terminal OUTPUT is stable at the high level VH. The first clock signal of the first clock signal terminal CK1 periodically jumps to a low level which turns on the first transistor M1 and the second transistor M2 and stabilizes the level of the first node N1 to be the high level VH, therefore ensuring a stable output of the output terminal OUTPUT, and reducing the noise.

Then, until the next frame arrives, after the shift register receives the low level signal of the input terminal INPUT, the above-described phases is re-executed.

The duty cycles of the first, second and third clock signal from the above-described first, second and third clock signal terminal are 33%.

The shift register according to the embodiments of the present disclosure adopts a series-connection transistor structure (for example, transistors M1 and M2 are connected in series, and transistors M7 and M8 are connected in series) and, by means of a timing control, connects a corresponding level to the connection points (for example, nodes N3 and N4) of the series-connection transistors to reduce the leakage current (for example, the leakage current of the second transistor M2 and the leakage current of the eighth transistor M8 are reduced), which reduces the influence of the pull-down phase (that is, the output phase) on the level of the gate electrode (that is, the level of the first node N1) of the driving transistor, and thereby eliminating the noise at the output terminal and improving the driving ability of the shift register.

The present disclosure further provides a driving method for the above-described shift register. Hereinafter, the method will be described in conjunction with FIG. 1 and FIG. 3. In an embodiment, for example, as illustrated in FIG. 1, the shift register includes an input unit 11, a pull-up unit 12, a pull-up control unit 13, a pull-down unit 14, a pull-down control unit 15, a first noise reduction unit 16, and a second noise reduction unit 17. The driving method for the shift register includes the following operations: providing the input signal to the first node N1 by the input unit 11; providing the voltage of the first supply voltage terminal VGH to the output terminal OUTPUT of the shift register by the pull-up unit 12; providing the voltage of the first supply voltage terminal VGH or the voltage of a second supply voltage terminal VGL to the second node N2 by the pull-up control unit 13; providing the third clock signal from the third clock signal terminal CK3 to the output terminal OUTPUT by the pull-down unit 14; providing the voltage of the first supply voltage terminal VGH to the first node N1 by the pull-down control unit 15; reducing electrical leakage of the input unit 11 to the first node N1 by adjusting the voltage of the third node N3 by the first noise reduction unit 16; and reducing electrical leakage of the pull-down control unit 15 to the first node N1 by adjusting the voltage of the fourth node N4 by the second noise reduction unit 17.

Here the first node N1 is a connection node among the input unit 11, the pull-down unit 14, the pull-down control unit 15 and the second noise reduction unit 17, the second node N2 is a connection node among the pull-up unit 12, the pull-up control unit 13, and the pull-down control unit 15, the third node N3 is a connection node between the first noise reduction unit 16 and the input unit 11, and fourth node N4 is a connection node between the second noise reduction unit 17 and the pull-down control unit 15.

In the present embodiment, the first supply voltage terminal VGH is a high supply voltage terminal while the second supply voltage terminal VGL is a low supply voltage terminal, and a duty cycle of the third clock signal from the above third clock signal terminal CK3 is 33%.

Figure 4:
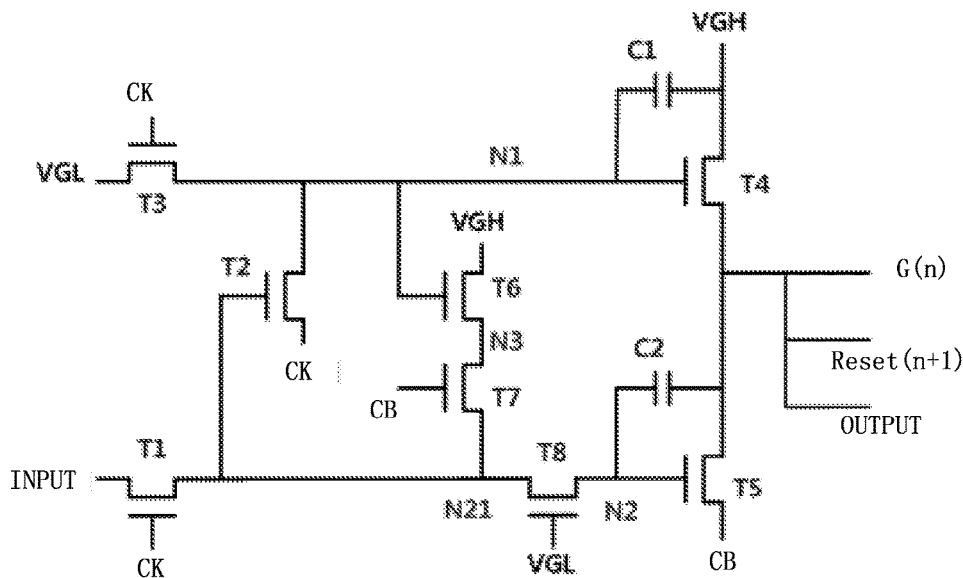
FIG. 4 shows a circuit structural diagram of a known shift register.
Figure 5:
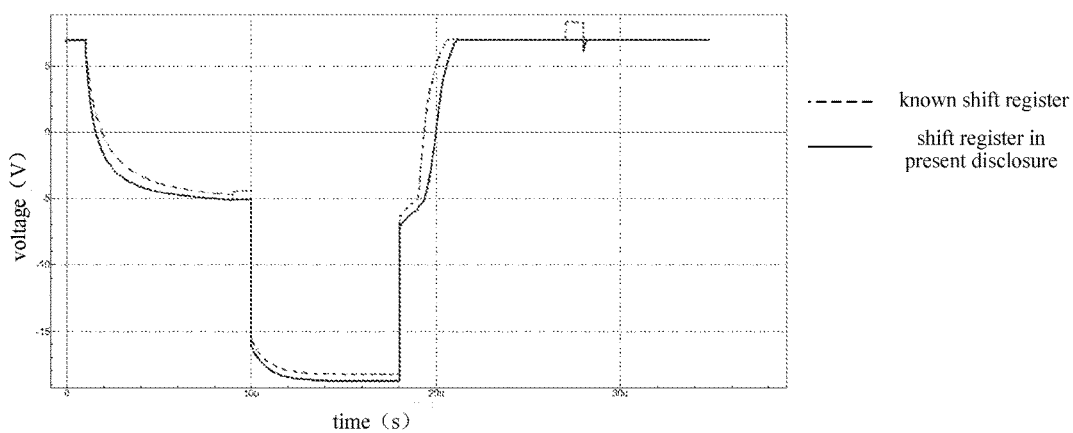
FIG. 5 is a comparison diagram illustrating levels of the gate electrodes of the driving transistors respectively for the shift register in FIG. 2 and the shift register in FIG. 4 with the same circuit parameters.
Figure 6:
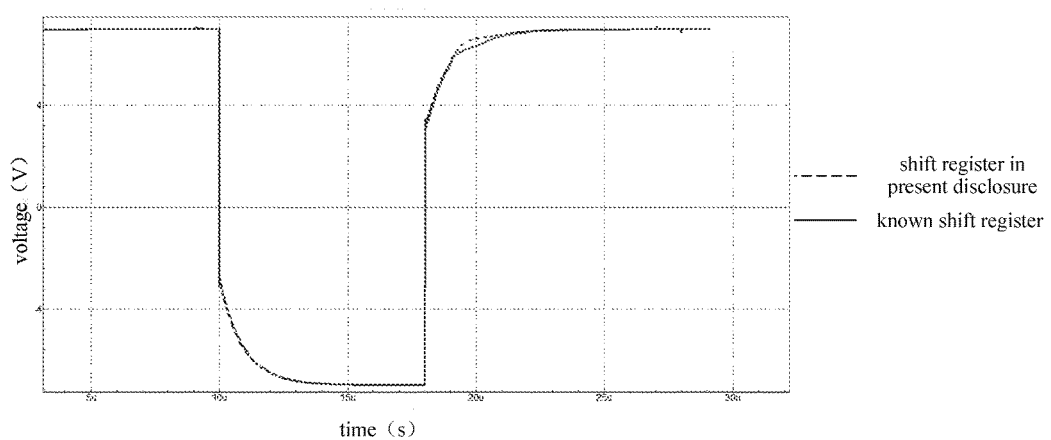
FIG. 6 is a comparison diagram illustrating the output levels of the driving transistors respectively for the shift register in FIG. 2 and the shift register in FIG. 4 with the same circuit parameters.

FIG. 4 shows a circuit structural diagram of a known shift register. FIG. 5 and FIG. 6 respectively show a comparison diagram between the gate level and the output level of the driving transistors in the shift register in FIG. 2 and the shift register in FIG. 4 with the same circuit parameters. As illustrated in FIG. 5 and FIG. 6, the driving ability of the shift register in an embodiment of the present disclosure and a known shift register as shown in FIG. 4 are compared under the same conditions regarding device size, device model, driving pulse width and load (10 Ω, 60 pF). It can be seen that, in the output phase, the gate level of the driving transistor in the shift register according to the embodiments of the present disclosure is better in the low potential holding effect than the gate level of the driving transistor of the known shift register. Therefore, the delay of the output level of the driving transistor in the shift register according to the embodiments of the present disclosure is correspondingly smaller than the delay of the output level of the driving transistor of the known shift register.

The shift register according to an embodiment of the present disclosure adopts a series-connection transistor structure and, by means of a timing control, connect a corresponding level at the connection points of the series-connection transistors to reduce the leakage current, which reduces the influence of the pull-down phase (that is, output phase) on the level of a gate electrode of the driving transistor, thereby eliminating the noise at the output terminal and improving the driving ability of the shift register.

An embodiment of the disclosure further provides a gate driving circuit, which includes the shift register in the above-described embodiments. The shift register in the gate driving circuit has the same advantages as the shift register in the above-described embodiments, and the redundant description will be omitted here.

An embodiment of the disclosure further provides a display apparatus, which includes the gate driving circuit in the above-described embodiments. Exemplarity, the display apparatus can be any products or components with display functions, such as organic light emitting diode display panels, electronic papers, mobile telephones, tablet computers, TVs, displays, notebook computers, digital picture frames, navigators or the like.

According to embodiments of the present disclosure, in the shift register and the driving method thereof, the gate driving circuit and the display apparatus including the shift register, the corresponding level is connected to the connection point of the series-connection transistors to reduce the leakage current at the output phase of the gate level of the driving transistor by the way of adopting a series-connection transistor structure and a timing control, thereby reducing the noise at the output terminal of the shift register and improving the driving ability of the shift register.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A shift register, comprising:
    an input unit, a first terminal of the input unit being connected with an input terminal of the shift register to receive an input signal from the input terminal, a second terminal of the input unit being connected with a first clock signal terminal, and a third terminal of the input unit being connected with a first node, and the input unit being configured to provide the input signal to the first node under control of a first clock signal from the first clock signal terminal;
    a pull-up unit, a first terminal of the pull-up unit being connected with a first supply voltage terminal, a second terminal of the pull-up unit being connected with a second node, and a third terminal of the pull-up unit being connected with an output terminal of the shift register, and the pull-up unit being configured to provide a voltage of the first supply voltage terminal to the output terminal under control of a voltage of the second node;
    a pull-up control unit, a first terminal of the pull-up control unit being connected with a second clock signal terminal, a second terminal of the pull-up control unit being connected with the first supply voltage terminal, a third terminal of the pull-up control unit being connected with the second node, a fourth terminal of the pull-up control unit being connected with the input terminal, and a fifth terminal of the pull-up control unit being connected with a second supply voltage terminal, and the pull-up control unit being configured to provide the voltage of the first supply voltage terminal to the second node under control of the input signal or to provide a voltage of the second supply voltage terminal to the second node under control of a second clock signal from the second clock signal terminal;
    a pull-down unit, a first terminal of the pull-down unit being connected with the first node, a second terminal of the pull-down unit being connected with a third clock signal terminal, and a third terminal of the pull-down unit being connected with the output terminal, and the pull-down unit being configured to provide a third clock signal from the third clock signal terminal to the output terminal under control of a voltage of the first node;
    a pull-down control unit, a first terminal of the pull-down control unit being connected with the first supply voltage terminal, a second terminal of the pull-down control unit being connected with the first node, and a third terminal of the pull-down control unit being connected with the second node, and the pull-down control unit being configured to provide the voltage of the first supply voltage terminal to the first node under control of a voltage of the second node;
    a first noise reduction unit, a first terminal of the first noise reduction unit being connected with the third clock signal terminal, a second terminal of the first noise reduction unit being connected with the output terminal, and a third terminal of the first noise reduction unit being connected with the third node, and the first noise reduction unit being configured to reduce electrical leakage of the input unit to the first node by adjusting a voltage of the third node; and
    a second noise reduction unit, a first terminal of the second noise reduction unit being connected with a fourth node, a second terminal of the second noise reduction unit being connected with the first node, and a third terminal of the second noise reduction unit being connected with the second supply voltage terminal, and the second noise reduction unit being configured to reduce electrical leakage of the pull-down control unit to the first node by adjusting a voltage of the fourth node;
    wherein the third node is a connection node between the first noise reduction unit and the input unit, and the fourth node is a connection node between the second noise reduction unit and the pull-down control unit.

2. The shift register of claim 1, wherein the input unit comprises:

a first transistor, with a gate electrode of the first transistor being connected with the first clock signal terminal, a first electrode of the first transistor being connected with the input terminal and a second electrode of the first transistor being connected with the third node; and a second transistor, with a gate electrode of the second transistor being connected with the first clock signal terminal, a first electrode of the second transistor being connected with the third node and a second electrode of the second transistor being connected with the first node.

3. The shift register of claim 2, wherein the pull-up unit comprises:

a third transistor, with a gate electrode of the third transistor being connected with the second node, a first electrode of the third transistor being connected with the first supply voltage terminal and a second electrode of the third transistor being connected with the output terminal; and a first capacitor, with a first end of the first capacitor being connected with the second node and a second end of the first capacitor being connected with the first supply voltage terminal.

4. The shift register of claim 3, wherein the pull-up control unit comprises:

a fourth transistor, with a gate electrode of the fourth transistor being connected with the input terminal, a first electrode of the fourth transistor being connected with the first supply voltage terminal and a second electrode of the fourth transistor being connected with the second node; and a fifth transistor, with a gate electrode of the fifth transistor being connected with the second clock signal terminal, a first electrode of the fifth transistor being connected with the second node and a second electrode of the fifth transistor being connected with the second supply voltage terminal.

5. The shift register of claim 4, wherein the pull-down unit comprises:

a sixth transistor, with a gate electrode of the sixth transistor being connected with the first node, a first electrode of the sixth transistor being connected with the output terminal and a second electrode of the sixth transistor being connected with the third clock signal terminal; and a second capacitor, with a first end of the second capacitor being connected with the first node and a second end of the second capacitor being connected with the output terminal.

6. The shift register of claim 5, wherein the pull-down control unit comprises:

a seventh transistor, with a gate electrode of the seventh transistor being connected with the second node, a first electrode of the seventh transistor being connected with the first supply voltage terminal and a second electrode of the seventh transistor being connected with the fourth node; and an eighth transistor, with a gate electrode of the eighth transistor being connected with the second node, a first electrode of the eighth transistor being connected with the fourth node and a second electrode of the eighth transistor being connected with the first node.

7. The shift register of claim 6, wherein the first noise reduction unit comprises:

a ninth transistor, with a gate electrode of the ninth transistor being connected with the output terminal, a first electrode of the ninth transistor being connected with the third clock signal terminal and a second electrode of the ninth transistor being connected with the third node.

8. The shift register of claim 7, wherein the second noise reduction unit comprises:

a tenth transistor, with a gate electrode of the tenth transistor being connected with the first node, a first electrode of the tenth transistor being connected with the fourth node and a second electrode of the tenth transistor being connected with the second supply voltage terminal.

9. The shift register of claim 8, wherein the transistors are all p-type transistors.

10. The shift register of claim 1, wherein duty cycles of the first, second and third clock signal from the first, second and third clock signal terminal are 33%.

11. The shift register of claim 1, wherein the first supply voltage terminal is a high supply voltage terminal while the second supply voltage terminal is a low supply voltage terminal.

12. A driving method applicable to a shift register comprising an input unit, a pull-up unit, a pull-up control unit, a pull-down unit, a pull-down control unit, a first noise reduction unit and a second noise reduction unit, the driving method comprising:

providing an input signal to a first node by the input unit;

providing a voltage of a first supply voltage terminal to an output terminal of the shift register by the pull-up unit;

providing the voltage of the first supply voltage terminal or a voltage of a second supply voltage terminal to a second node by the pull-up control unit;

providing a third clock signal from a third clock signal terminal to the output terminal by the pull-down unit;

providing the voltage of the first supply voltage terminal to the first node by the pull-down control unit;

reducing electrical leakage of the input unit to the first node by adjusting a voltage of a third node by the first noise reduction unit; and reducing electrical leakage of the pull-down control unit to the first node by adjusting a voltage of a fourth node by the second noise reduction unit;

wherein the first node is a connection node among the input unit, the pull-down unit, the pull-down control unit and the second noise reduction unit, the second node is a connection node among the pull-up unit, the pull-up control unit, and the pull-down control unit, the third node is a connection node between the first noise reduction unit and the input unit, and the fourth node is a connection node between the second noise reduction unit and the pull-down control unit, the first supply voltage terminal is a high supply voltage terminal while the second supply voltage terminal is a low supply voltage terminal, and a duty cycle of the third clock signal from the third clock signal terminal is 33%.

13. A gate driving circuit, comprising the shift register according to claim 1.

14. A display apparatus, comprising the gate driving circuit according to claim 13.

* * * * *